US010188017B2

(12) United States Patent
Gauthier et al.

(10) Patent No.: US 10,188,017 B2
(45) Date of Patent: Jan. 22, 2019

(54) SERVER COOLING FLUID INLET AND PICKUP PLACEMENT IN SUBMERGED COOLING ENCLOSURES

(71) Applicant: Microsoft Technology Licensing, LLC, Redmond, WA (US)

(72) Inventors: David Thomas Gauthier, Seattle, WA (US); Michael Rees Helsel, Seattle, WA (US); Nicholas Andrew Keehn, Kirkland, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/610,157

(22) Filed: May 31, 2017

(65) Prior Publication Data
US 2018/0352682 A1 Dec. 6, 2018

(51) Int. Cl.
*H05K 7/20* (2006.01)
*H05K 1/03* (2006.01)

(52) U.S. Cl.
CPC ....... *H05K 7/20781* (2013.01); *H05K 1/0393* (2013.01); *H05K 7/20836* (2013.01)

(58) Field of Classification Search
CPC . H05K 2201/0154; H05K 2201/10106; H05K 7/20236; H05K 7/203; H05K 1/0393; H05K 7/20772; H05K 7/20818; H05K 2201/0959; H05K 3/4688; H05K 7/2039; H05K 7/20781; H05K 1/0203; H05K 7/20;

(Continued)

(56) References Cited

U.S. PATENT DOCUMENTS

| 7,450,384 | B2 | 11/2008 | Tavassoli et al. |
| 7,639,499 | B1 | 12/2009 | Campbell et al. |
| 7,787,248 | B2 | 8/2010 | Campbell et al. |

(Continued)

OTHER PUBLICATIONS

Al-Anii, et al., "Effect of processor layout on the thermal performance of fully immersed liquid-cooled microelectronics", In Proceedings of the 14 International Conference on Simulation and Experiments in Heat Transfer and its Applications, Sep. 7, 2016, pp. 127-138.

(Continued)

*Primary Examiner* — Adam B Dravininkas
(74) *Attorney, Agent, or Firm* — Mannava & Kang, P.C.

(57) ABSTRACT

In an example, a cooling device is provided. The cooling device includes a connection block including a surface, an inlet passage, and an outlet passage. The cooling device includes a first membrane defining a first volume with a first opening at a first end thereof. The first membrane sealingly engages with the surface around the inlet passage. The cooling device includes a second membrane defining a second volume with a second opening at a second end thereof. The second membrane also defines a plurality of apertures and sealingly engages with the surface inside of the first membrane and around the outlet passage. The cooling device also includes a substrate arranged in the second membrane, is connected to the surface, and includes a heat-generating device. Coolant fluid flows into the first volume via the inlet passage, through the plurality of apertures into the second volume, and exits via the outlet passage.

20 Claims, 10 Drawing Sheets

(58) Field of Classification Search
CPC ........... H05K 7/20763; H05K 7/20827; H05K 7/20836
See application file for complete search history.

(56) References Cited

U.S. PATENT DOCUMENTS

| | | | |
|---|---|---|---|
| 7,905,106 B2 | 3/2011 | Attlesey |
| 7,911,793 B2 | 3/2011 | Attlesey |
| 7,961,475 B2 | 6/2011 | Campbell et al. |
| 8,081,478 B1 | 12/2011 | Drexler et al. |
| 8,089,765 B2 | 1/2012 | Attlesey |
| 8,184,436 B2 | 5/2012 | Campbell et al. |
| 9,049,800 B2 | 6/2015 | Shelnutt et al. |
| 9,176,547 B2 | 11/2015 | Attlesey |
| 9,461,726 B2 | 9/2016 | Regimbal et al. |
| 9,464,854 B2* | 10/2016 | Shelnutt ................. F28F 27/02 |
| 9,781,862 B2* | 10/2017 | Kolstad .............. H05K 7/20245 |
| 2007/0034360 A1 | 2/2007 | Hall |
| 2007/0133171 A1 | 6/2007 | Cheon |
| 2007/0199340 A1 | 8/2007 | Knight et al. |
| 2008/0273303 A1 | 11/2008 | Pal |
| 2010/0101759 A1 | 4/2010 | Campbell et al. |
| 2010/0101765 A1 | 4/2010 | Campbell et al. |
| 2011/0132579 A1 | 6/2011 | Best et al. |
| 2011/0187188 A1 | 8/2011 | Yang |
| 2011/0268410 A1 | 11/2011 | Giraud et al. |
| 2011/0317367 A1 | 12/2011 | Campbell et al. |
| 2012/0173444 A1 | 7/2012 | Zik |
| 2013/0081790 A1 | 4/2013 | Tufty et al. |
| 2013/0083479 A1 | 4/2013 | Tufty et al. |
| 2014/0216686 A1 | 8/2014 | Shelnutt et al. |
| 2014/0218859 A1* | 8/2014 | Shelnutt ................. G06F 1/206 361/679.46 |
| 2014/0301037 A1 | 10/2014 | Best |
| 2015/0146368 A1 | 5/2015 | Shafer et al. |
| 2015/0257301 A1 | 9/2015 | Morgan et al. |
| 2015/0336053 A1* | 11/2015 | Dow ........................ B01D 3/12 202/185.2 |
| 2015/0382511 A1* | 12/2015 | James ................ H05K 7/20709 361/679.46 |
| 2015/0382515 A1* | 12/2015 | James ................ H05K 7/20818 361/679.47 |
| 2016/0095253 A1 | 3/2016 | Tufty et al. |
| 2016/0165748 A1* | 6/2016 | Chen ..................... B23P 15/26 165/46 |
| 2016/0238266 A1 | 8/2016 | O'donnell et al. |
| 2016/0301344 A1 | 10/2016 | Pepe |
| 2016/0324033 A1 | 11/2016 | Shafer et al. |
| 2016/0360649 A1 | 12/2016 | Regimbal et al. |
| 2017/0064862 A1* | 3/2017 | Miyoshi ................. H05K 7/203 |
| 2017/0145573 A1* | 5/2017 | McWhinney ........... C25B 13/02 |
| 2017/0150649 A1 | 5/2017 | Chester et al. |
| 2017/0156233 A1 | 6/2017 | Moss et al. |
| 2017/0181325 A1 | 6/2017 | Shelnutt et al. |
| 2017/0181329 A1 | 6/2017 | Shelnutt et al. |
| 2017/0320019 A1* | 11/2017 | Doyen ................. B01D 63/081 |
| 2017/0325358 A1 | 11/2017 | Franz et al. |
| 2017/0350625 A1 | 12/2017 | Burns et al. |
| 2018/0135235 A1 | 5/2018 | Yu |

OTHER PUBLICATIONS

"FAQ Iceotope", Retrieved From <<https://web.archive.org/web/20161030174142/http://www.iceotope.com/faq/>>, 2016, 5 Pages.

"Liquid Dielectric", Retrieved From <<https://en.wikipedia.org/wiki/Liquid_dielectric>>, Jan. 19, 2017, 3 Pages.

"MB-49-L06 Water Block (Motherboard)", Retrieved From <<http://koolance.com/index.php?route=product/product&product_id=470>>, Apr. 4, 2007, 2 Pages.

"Products—Liquid Cool Solutions", Retrieved From <<http://www.liquidcoolsolutions.com/products>>, 2009, 7 Pages.

"Quick couplings", Retrieved From <<http://www.staubli.com/en/connectors/quick-couplings/>>, Jan. 30, 2017, 2 Pages.

"The Carnotjet System", Retrieved From <<https://web.archive.org/web/20161129203739/http://www.grcooling.com/carnotjet//>>, Retrieved on: Nov. 29, 2016, 5 Pages.

Miller, Rich, "Intel Embraces Submerging Servers in Oil", Retrieved From <<http://www.datacenterknowledge.com/archives/2012/09/04/intel-explores-mineral-oil-cooling/>>, Sep. 4, 2012, 5 Pages.

Miller, Rich, "Iceotope Gets $10 Million Funding, Partners With Schneider", Retrieved From <<http://www.datacenterknowledge.com/archives/2014/01/14/iceotope-gets-10-million-funding-partners-schneider>>, Jan. 14, 2014, 3 Pages.

Mohapatra, Satish C., "An Overview of Liquid Coolants for Electronics Cooling", Retrieved From <<https://www.electronics-cooling.com/2006/05/an-overview-of-liquid-coolants-for-electronics-cooling>>, May 1, 2006, 10 Pages.

Bigelow, Stephen J., "Liquid immersion cooling relief for ultra-dense data centers", Retrieved From <<http://searchdatacenter.techtarget.com/feature/Liquid-immersion-cooling-relief-for-ultra-dense-data-centers>>, Oct. 2014, 5 Pages.

* cited by examiner

SERVER COOLING FLUID INLET AND PICKUP PLACEMENT IN SUBMERGED COOLING ENCLOSURES

FIELD

The present disclosure relates to systems and methods for thermal cooling of heat-generating devices and, more particularly, to systems and methods for cooling heat-generating devices using fluid submersion.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Datacenters house bulk data storage and computing resources such as physical machines, virtual machines, and containers. Data service providers rent the data storage and computing resources to tenants. As the demand increases, packing of the data storage and computing resources also increases. For example, a server room in the datacenter may include a large number of racks of computing and storage devices including servers, routers and hard disk drives. Each of these storage and computing devices generates heat during operation. If the ambient temperature in the server room increases too high, performance decreases and/or damage may occur due to overheating.

SUMMARY

In an example, a cooling device is provided. The cooling device includes a connection block including a surface, an inlet passage, and an outlet passage. The cooling device includes a first membrane defining a first volume with a first opening at a first end thereof. The first membrane is sealingly engaged with the surface around the inlet passage. The cooling device includes a second membrane defining a second volume with a second opening at a second end thereof. The second membrane also defines a plurality of apertures and is sealingly engaged with the surface inside of the first membrane and around the outlet passage. The cooling device also includes a substrate that is arranged in the second membrane, that is connected to the surface, and that includes a heat-generating device. Coolant fluid flows into the first volume via the inlet passage, through the plurality of apertures into the second volume, and exits via the outlet passage.

In other features, the cooling device includes a first closure structure configured to create a liquid impermeable seal at an interface formed between the surface and the first membrane, and a second closure structure configured to create a liquid impermeable seal at an interface formed between the surface and the second membrane.

In other features, the cooling device includes adhesive to create a liquid impermeable seal at an interface formed between the surface and the first membrane and the surface and the second membrane. In other features, the cooling device includes thermoplastic material to create a first liquid impermeable seal at an interface formed between the surface and the first membrane and the surface and the second membrane. In other features, the cooling device includes an elastic material to create a liquid impermeable seal at an interface formed between the surface and the first membrane and the surface and the second membrane. In other features, the substrate includes a printed circuit board and the heat-generating device includes an electronic device or a heat sink.

In other features, the cooling device includes internal support structures arranged inside of the second volume to internally support the second membrane. In other features, the internal support structures include internal fluid passages. In other features, the cooling device includes nozzles connected to one or more internal support structures to direct fluid towards the heat-generating devices. In other features, the substrate includes a first connector and the connection block includes a second connector, and the first connector is configured to mate with the second connector. In other features, the substrate receives data and power signals via the first and second connectors.

In an example, a cooling device is provided. The cooling device includes a connection block including a surface, an inlet passage, and an outlet passage. The cooling device also includes a membrane defining a volume with a first opening at a first end thereof. The membrane is sealingly engaged with the surface around the inlet passage and the outlet passage. The cooling device also includes a substrate that is arranged in the membrane, that is connected to the surface, and that includes a heat-generating device. The coolant fluid flows into the volume via the inlet passage and exits via the outlet passage. The cooling device also includes a conduit in fluid communication with the inlet passage or the outlet passage. The conduit extends outwardly from the connection block in a cantilever configuration.

In other features, the cooling device includes a closure structure configured to create a liquid impermeable seal at an interface formed between the surface and the membrane. In other features, the cooling device includes adhesive to create a liquid impermeable seal at an interface formed between the surface and the membrane. In other features, the cooling device includes thermoplastic material to create a liquid impermeable seal at an interface formed between the surface and the membrane. In other features, the cooling device includes an elastic material to create a liquid impermeable seal at an interface formed between the surface and the membrane.

In other features, the connection block and the substrate define a channel configured to receive the membrane. In other features, the cooling device includes internal support structures arranged inside of the volume to internally support the membrane. In other features, the cooling device includes nozzles connected to one or more internal support structures to direct fluid towards the heat-generating devices.

In an example, a cooling device for fluid submersion of heat-generating devices is provided. The cooling device includes a connection block including a surface, an inlet passage, and an outlet passage. The cooling device also includes a first membrane defining a first volume with a first opening at a first end thereof. The first membrane is sealingly engaged with the surface around the inlet passage. The cooling device also includes a second membrane defining a second volume with a second opening at a second end thereof and defining a plurality of apertures. The second membrane is sealingly engaged with the surface inside of the first membrane and around the outlet passage. The cooling device also includes a substrate that is arranged in the second membrane, that is connected to the surface, and that includes a heat-generating device. The coolant fluid flows into the first volume, through the plurality of apertures into the second volume, and exits the outlet passage. The cooling device also includes internal support structures arranged inside of the second volume to internally support the second membrane.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

In the drawings, reference numbers may be reused to identify similar and/or identical elements.

DESCRIPTION

Datacenters, server rooms, and other facilities operate a large number of heat-generating devices such as servers, routers, bulk data storage devices such as hard disk drives, or other electronic devices in close proximity. Cooling systems may be used to prevent failure due to overheating. In some instances, liquid cooling is used to cool the heat-generating devices.

Systems and methods according to the present disclosure provide liquid cooling for heat-generating devices such as data storage and computing devices. For example, one or more membranes are attached to a connection block to define one or more volumes around a heat-generating device. Fluid is introduced into the one or more volumes to absorb and subsequently remove the heat.

Figure 1:
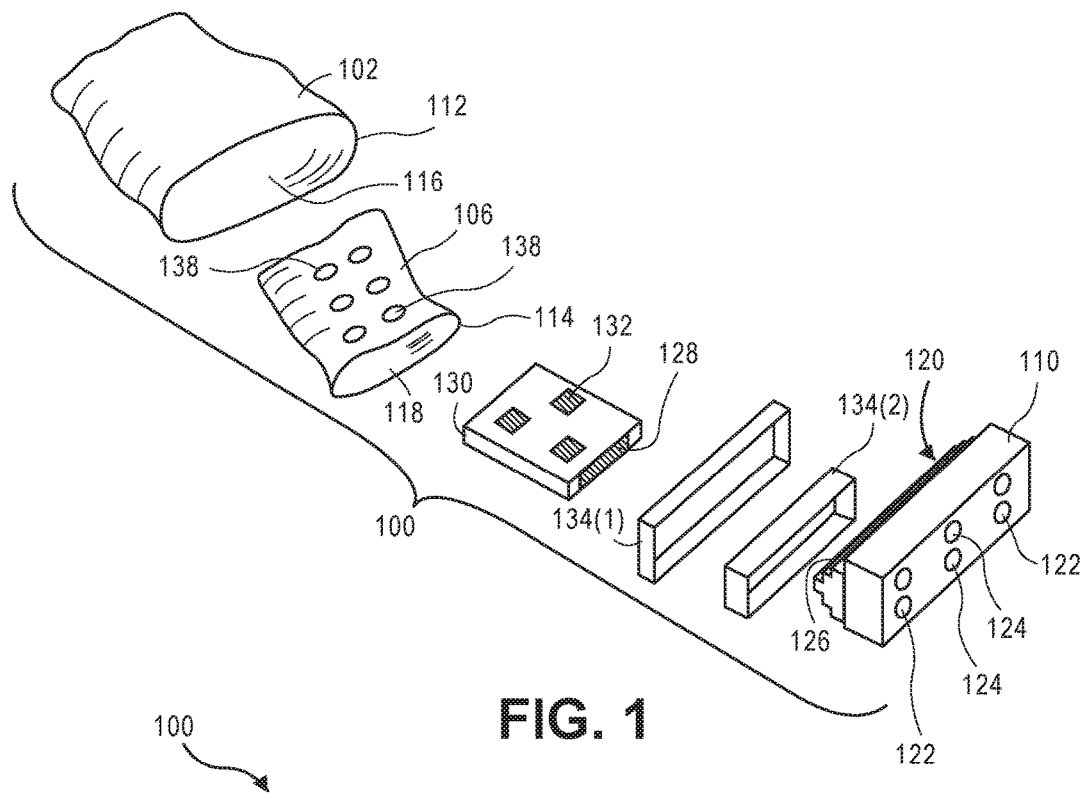
FIG. 1 is an exploded view of a cooling system in accordance with an example embodiment of the present disclosure.
Figure 2:
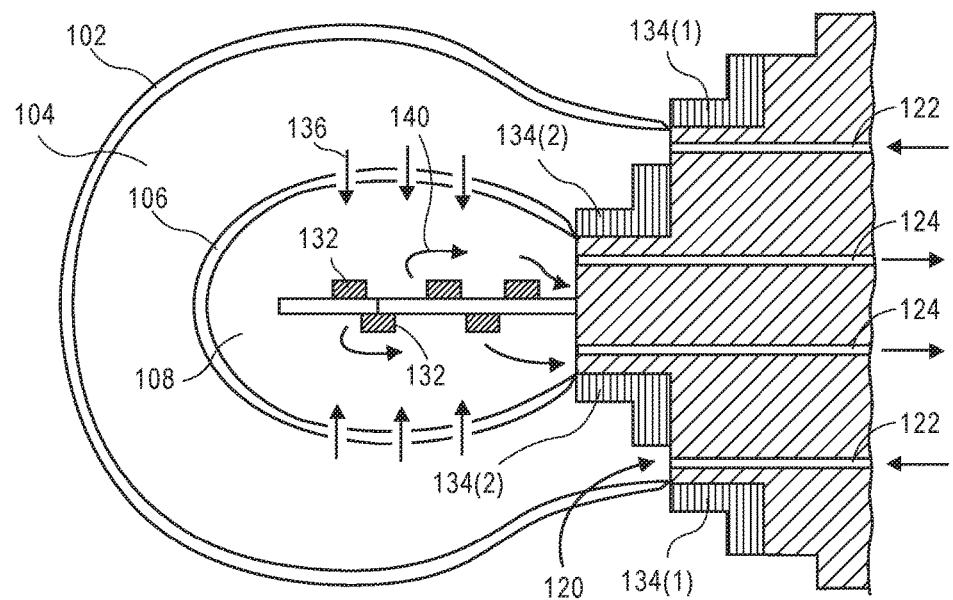
FIG. 2 is a cross-sectional view of the cooling system in accordance with an example embodiment of the present disclosure.

FIGS. 1 and 2 illustrate an example cooling system 100 in accordance with an example embodiment of the present disclosure. The cooling system 100 includes a first membrane 102 defining a first volume 104 and a second membrane 106 defining a second volume 108. The first membrane 102 and/or the second membrane 106 are manufactured from fluid impermeable materials. For example, the first membrane 102 and/or the second membrane 106 are manufactured from one or more materials that are impermeable, such as plastics, elastomeric layers, impermeable polymer films, graphene, elastomer/graphite nano-composites, resins, metalized plastic, multilayer graphite films, or other materials.

The first membrane 102 and/or the second membrane 106 may be manufactured from a flexible, semi-rigid, and/or rigid material. In some examples, the first membrane 102 and the second membrane 106 have the same or different rigidity. For example, the first membrane 102 is flexible, and the second membrane 106 is rigid or semi-rigid, or vice versa.

The cooling system 100 includes a connection block 110 that is connected to a first end 112 of the first membrane 102 and a first end 114 of the second membrane 106. For example, the first membrane 102 defines an opening 116 about the first end 112, and the second membrane 106 defines an opening 118 about the first end 114. The membranes 102, 106 are received at the connection block 110 to form a cooling enclosure. The first end 112 of the first membrane 102 and the first end 114 of the second membrane 106 mechanically connect to a coolant-space-facing surface 120. In various embodiments, the coolant-space-facing surface 120 of the connection block 110 is chemically inert with respect to the coolant fluid to which the coolant-space-facing surface 120 is exposed.

The connection block 110 includes inlet passages 122 for providing coolant fluid to the cooling system 100. The connection block 110 also includes outlet passages 124 for evacuating coolant fluid from the cooling system 100. In some examples, specific passages 122, 124 are used to provide and/or evacuate coolant fluid of a specific type. For example, a first inlet passage 122 and a first outlet passage 124 are used to provide and remove a coolant fluid of a first type, such as coolant fluid in liquid form. In another example, a second inlet passage 122 and a second outlet passage 124 are used to provide and remove a coolant fluid of a second type, such as coolant fluid having a gaseous form. In some examples, a third inlet passage 122 and a third outlet passage 124 are used to provide a coolant fluid of a first type and remove a coolant fluid of a second type. In these examples, an external connector is connected to the corresponding passages 122, 124 to introduce cooling fluid of the specific type and/or to evacuate cooling fluid of the specific type. The remaining passages 122, 124 can be sealed to prevent unintended evacuation of the coolant fluid.

As used herein, coolant fluid refers to a liquid, a liquid mixture, a gas, a gas mixture, or a mixture of liquids and gases. In some examples, the coolant fluid includes a dielectric fluid, such as mineral oil, castor oil, silicon oil, or the like. The coolant fluid absorbs heat generated by heat-generating devices or heat sinks. In various embodiments, the coolant fluid may fully or partially vaporize into a gas in response to absorption of the heat generated by the heat-generating devices.

As shown in FIGS. 1 and 2, the connection block 110 includes a connector 126 that connects a connector 128 of a substrate 130. The substrate 130 includes one or more heat-generating devices 132 mounted thereon. For example, the substrate 130 may include a printed circuit board (PCB) or a semiconductor package. The heat-generating devices 132 may include electronic devices, such as integrated circuits, discrete components, such as capacitors, resistors, inductors, or the like, and heat sinks. In some examples, the heat-generating devices 132 are encapsulated. The connector 126 mates with the connector 128 to establish a connection between the heat-generating devices 132 and external devices. Once the connection is established, the electronic devices of the substrate 130 receive power from and/or exchange data with the external devices.

The cooling system 100 includes one or more closure structures 134, such as a first closure structure 134(1) and/or a second closure structure 134(2), that create liquid impermeable seals with the ends 112, 114, respectively, and the connection block 110. For example, the closure structures 134(1), 134(2) seal an interface between the coolant-space-facing surface 120 and the respective membrane 102, 106. In some examples, the closure structures 134(1), 134(2) are attached to the connection block 110 using any suitable approach such as fasteners, adhesive, compression, and combinations thereof. In some examples, the closure structures 134(1), 134(2) are attached using a suitable elastic force. The closure structures 134(1), 134(2) may be formed of plastic, rubber, metal, resin, composite, and/or other material which has sufficient rigidity and strength to prevent leakage of coolant fluid from the cooling system 100 when the cooling system 100 is assembled.

While the connection block 110 and the closure structures 134 are shown as including a generally rectangular configuration, it is understood that the connection block 110 and the closure structures 134 may include other configurations as well. In some examples, the connection block 110 and the closure structures 134 include a generally rounded, or circular, configuration.

Referring to FIG. 2, coolant fluid is introduced within the cooling system 100 by way of the inlet passages 122. The coolant fluid enters the first volume 104 defined by the first membrane 102, which is represented by arrows 136.

Coolant fluid enters the second volume 108 through one or more apertures 138 (i.e., orifices) defined in the second membrane 106. As a result, the coolant fluid is in thermal communication with the respective heat-generating devices 132. Heat from the heat-generating devices 132 is transferred to the coolant fluid, which increases the temperature of the coolant fluid. A pressure differential can be created between the first volume 104 and the second volume 108 based upon the introduction of the coolant fluid into the first volume 104 at a desired inlet flowrate and evacuating fluid from the second volume 108 at a desired outlet flowrate. In some examples, a pump, multiple pumps, and/or mass flow controllers can be used to control the desired inlet flowrate and the desired outlet flowrate. The coolant fluid absorbs heat generated by the heat-generating devices 132 to maintain the heat-generating devices 132 at a desired operating temperature. As used herein, the desired operating temperature refers to a temperature at which the heat-generating devices 132 operate without risk of damage from heat produced by the operation of the one or more heat-generating devices 132.

Coolant fluid exits the second volume 108 by way of the outlet passage 124, as represented by arrows 140. In some embodiments, a pump is connected to one or more of the outlet passages 124 to evacuate fluid from the second volume 108. For example, a pump can be used to remove coolant fluid within the cooling system 100 from the first volume 104 and/or the second volume 108 prior to disconnecting the first membrane 102 and/or the second membrane 106, respectively.

Figure 3:
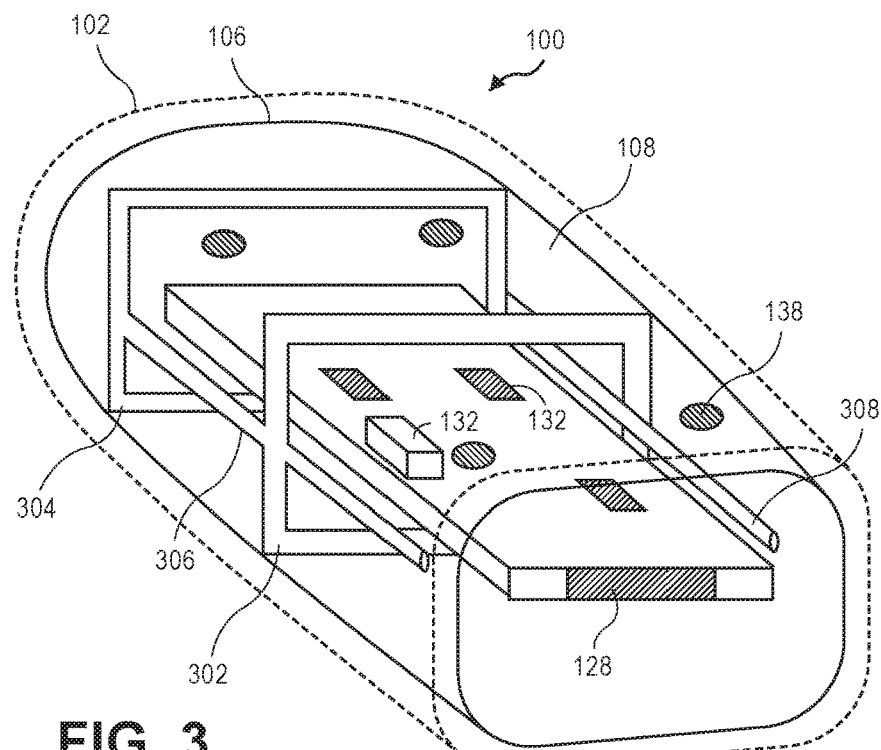
FIG. 3 is an isometric view of the cooling system in accordance with an example embodiment of the present disclosure.
Figure 4:
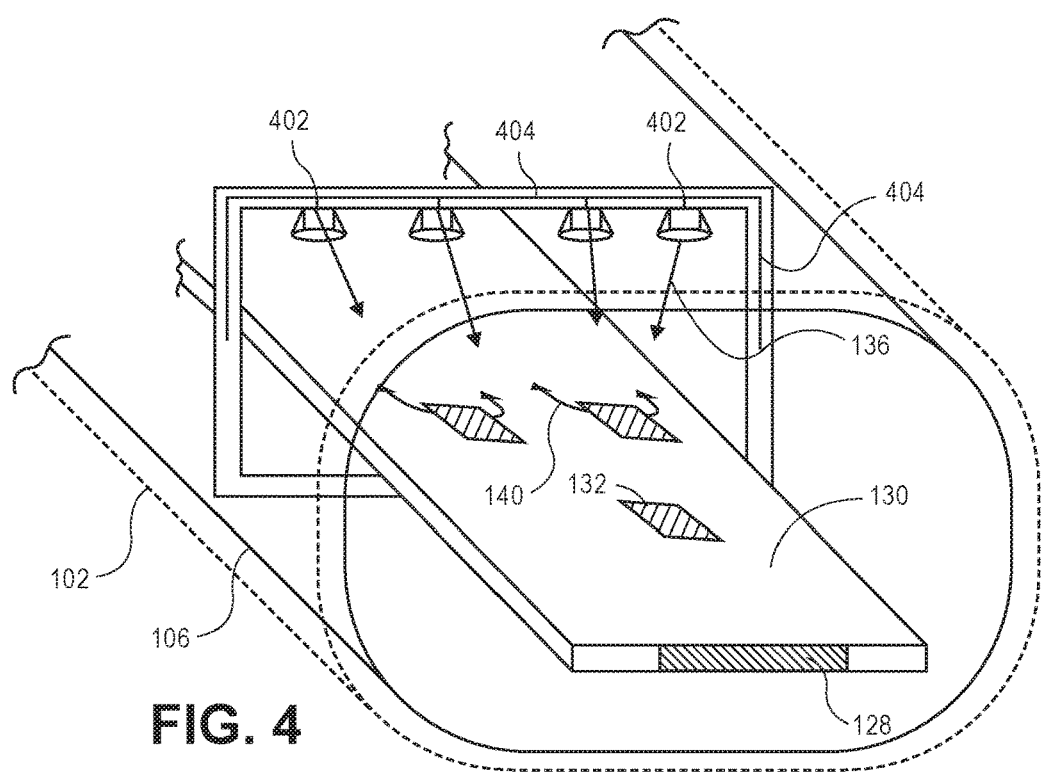
FIG. 4 is an isometric view of an internal support structure having one or more fluid outlets thereon in accordance with an example embodiment of the present disclosure.

Referring to FIGS. 3 and 4, the cooling system 100 may include internal support structures 302, 304 that support the membrane 106. The cooling system 100 employs the internal support structures 302, 304 to prevent the membrane 106 from collapsing and/or coming into contact with the heat-generating devices 132 due to the pressure differential between the first volume 104 and the second volume 108. It is understood that internal support structures 302, 304 can also be used to internally support the membrane 102.

Support structures 306, 308 are used to support the internal support structures 302, 304. The support structures 306, 308 mechanically connect, in a cantilevered configuration, with the connection block 110 and extend outwardly from the connection block 110. For example, the support structures 306, 308 extend along an axis in a direction that is generally perpendicular to a plane parallel to the coolant-space-facing surface 120. As can be appreciated, the internal support structures 302, 304 and the support structures 306, 308 may be configured in other ways. In some examples, the internal support structures 302, 304 and the support structures 306, 308 are manufactured from a rigid material formed of plastic, rubber, metal, resin, composite, or other material having sufficient rigidity and strength to support the membrane 106. The support structures 302, 304, 306, 308 can also provide protection during handling and/or installation events. For example, the support structures 302, 304, 306, 308 can provide protection to the substrate 130 and/or other components during handling, installation, and/or shipping.

Figure 5:
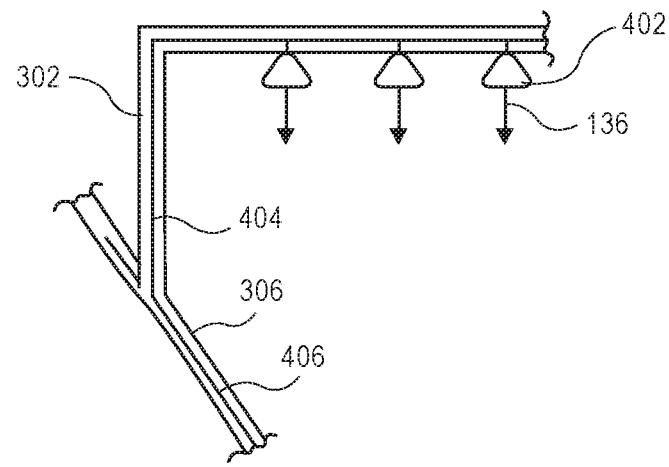
FIG. 5 is another isometric view of the internal support structure having one or more fluid outlets thereon in accordance with an example embodiment of the present disclosure, wherein the internal support structure is connected with a corresponding support structure.

In some examples, as shown in FIGS. 4 and 5, the internal support structures 302, 304 include fluid outlets 402 that supply the coolant fluid into the volume 108. For example, the fluid outlets 402 include nozzles that receive the coolant fluid from channels 404 that define fluid passages within internal support structures 302, 304. The fluid outlets 402 disperse the coolant liquid into the volume 108 to absorb heat. The fluid outlets 402 can employ a variety of configurations. For example, the fluid outlets 402 include a nozzle that disperses the coolant fluid as a single focused stream of coolant fluid or as a spray. In some embodiments, the cooling system 100 employs combinations of nozzle types. For example, the cooling system 100 can employ one nozzle to direct coolant fluid as a spray and another nozzle to direct coolant fluid as a jet.

As shown in FIG. 5, the support structures 306, 308 include channels 406 defining internal passages that can supply the coolant fluid from the connection block 110 to the fluid outlets 402. A channel 406 is connected to one of the inlet passages 122 to receive coolant fluid. The channel 406 subsequently provides the coolant fluid to the channel 404. It is understood that the support structures 302, 304, 306, 308 and/or the fluid outlets 402 may be employed in any of the embodiments of the cooling system 100 described herein.

Figure 6:
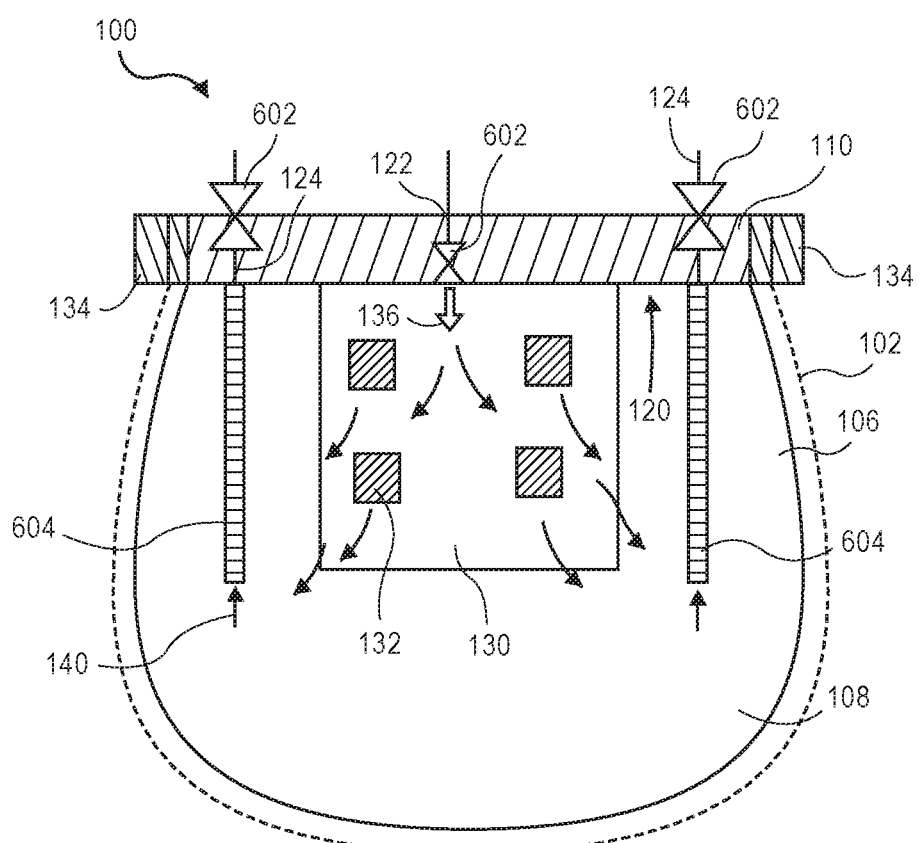
FIG. 6 is a plan view of a cooling system in accordance with another embodiment of the present disclosure.

As shown in FIG. 6, in an example embodiment, the cooling system 100 employs valves 602 to control a flowrate within the cooling system 100. For example, the inlet passages 122 and/or the outlet passages 124 are in communication with valves 602 to control inlet and/or outlet flowrates, respectively. The cooling system 100 includes one or more outlet conduits 604. The outlet conduits 604 define passages and extend outwardly along an axis defined perpendicular to a plane parallel to the coolant-space-facing surface 120 in a cantilever configuration. In some embodiments, the outlet conduits 604 are manufactured from a rigid material formed of plastic, rubber, metal, resin, composite, or other material having sufficient rigidity and strength to extend outwardly from the connection block 110.

The coolant fluid enters the volume 108 defined by the membrane 106 through the inlet passage 122. The outlet conduits 604 remove coolant fluid from the volume 108. The outlet conduits 604 receive the coolant fluid and provide the received coolant fluid to the outlet passages 124.

Figure 7:
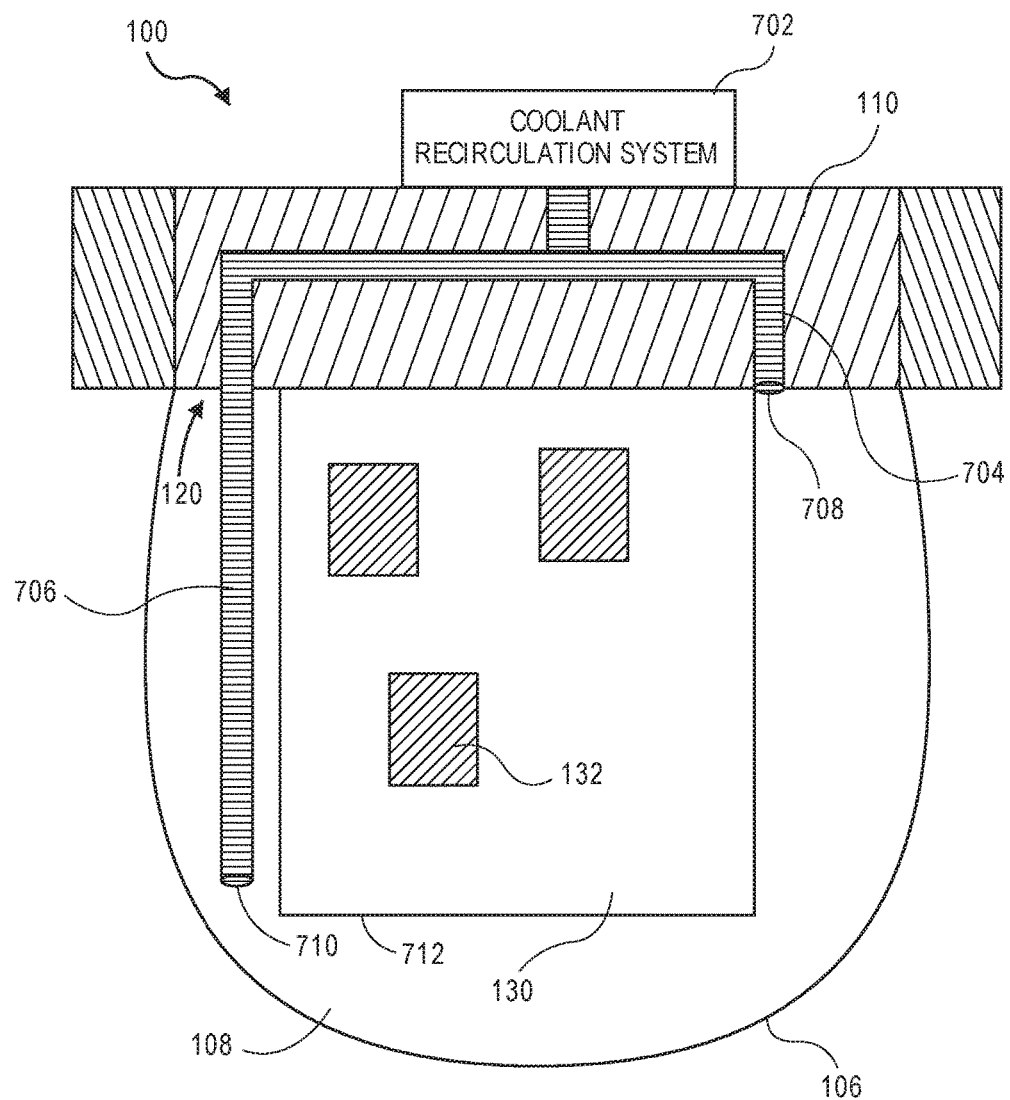
FIG. 7 is a plan view of a cooling system in accordance with another embodiment of the present disclosure.

FIG. 7 illustrates another example embodiment of the cooling system 100 according to the present disclosure. As shown, the cooling system 100 employs a coolant circulation system 702 and a membrane 106 that defines a volume 108. In some embodiments, the coolant circulation system 702 can be disposed external to the connection block 110 or internal to the connection block 110. Coolant fluid is delivered to the volume 108 via an outlet conduit 704 from the coolant circulation system 702.

The cooling system 100 includes an inlet conduit 706 that defines a passage for receiving coolant fluid. In one example, coolant fluid is evacuated at an inlet conduit 706 and is circulated through the coolant circulation system 702. While the conduit 704 is described as the outlet conduit and the conduit 706 is described as the inlet conduit, it is understood that the conduit 704 can function as the inlet conduit and the conduit 706 can function as the outlet conduit. As shown, an opening 708 of the conduit 704 is disposed adjacent to the coolant-space-facing surface 120. The conduit 706 extends outwardly from the connection block 110 in a cantilever configuration, and an opening 710 of the conduit 706 is proximate to an end 712 of the substrate 130.

Figure 8:
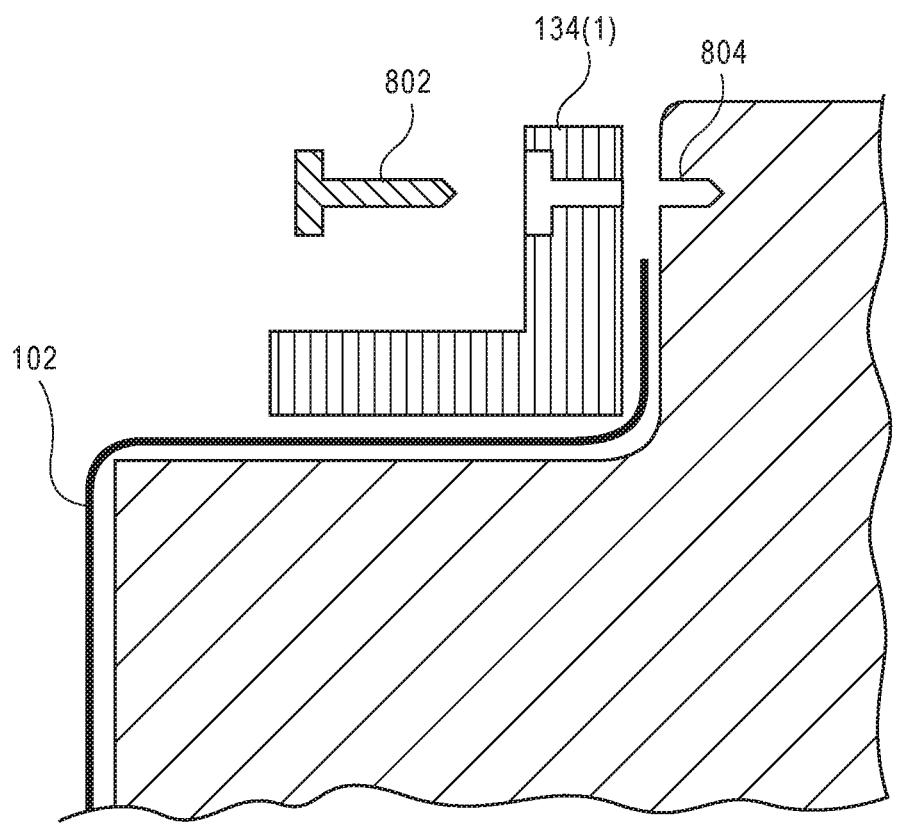
FIG. 8 is a cross-sectional view of a connection block that receives a closure structure for maintaining a membrane taut with respect to connection block in accordance with an example embodiment of the present disclosure.

FIG. 8 illustrates an example closure structure 134 that is received by the connection block 110 to form a liquid impermeable seal at the interface of the connection block 110 and the closure structure 134. The closure structure 134 applies force against the membrane 102 to provide a seal to the connection block 110. In some examples, the closure structure 134 is fastened to the connection block 110. For example, a fastener, such as a bolt 802, is received by a corresponding bore 804 to secure the closure structure 134 to the connection block 110. It is understood that the closure structure 134 can also apply a force against the membrane 106 to provide a seal to the connection block 110.

It is understood that the membranes 102, 106 can be connected to the connection block 110 in other ways. For example, the cooling system 100 can employ adhesive. The adhesive can be applied to the connection block 110 and/or a respective end 112, 114 of the membranes 102, 106. The respective membrane 102, 106 is then connected to the connection block 110 to form the respective volumes 104, 108.

The membranes 102, 106 can also be connected to the connection block using heat sealing. In these embodiments, the membranes 102, 106 include a thermoplastic material. A heating device that generates heat and/or pressure is positioned in contact with the respective end 112, 114 of the membrane 102, 106 when the end 112, 114 is positioned adjacent to the connection block 110. Through application of heat and/or pressure, contact areas of the respective end 112, 114 contact to create a seal with the connection block 110.

Additionally, the membranes 102, 106 can be connected to the connection block 110 using compression sealing. For example, the closure structures 134(1), 134(2) may include an elastic material having an area smaller than an area than the corresponding area of the receiving portions of the connection block 110 when the closure structures 134(1), 134(2) are in a non-stretched state. The closure structures 134(1), 134(2) are expanded into a stretched state, placed over the membrane 102, 106 and the connection block 110, and then released. The closure structures 134(1), 134(2) exert a force on the corresponding membranes 102, 106. The respective membranes 102, 106 are compressed by the force against the connection block 110. A seal is created between the closure structure 134(1), 134(2) and the connection block 110.

Figure 9:
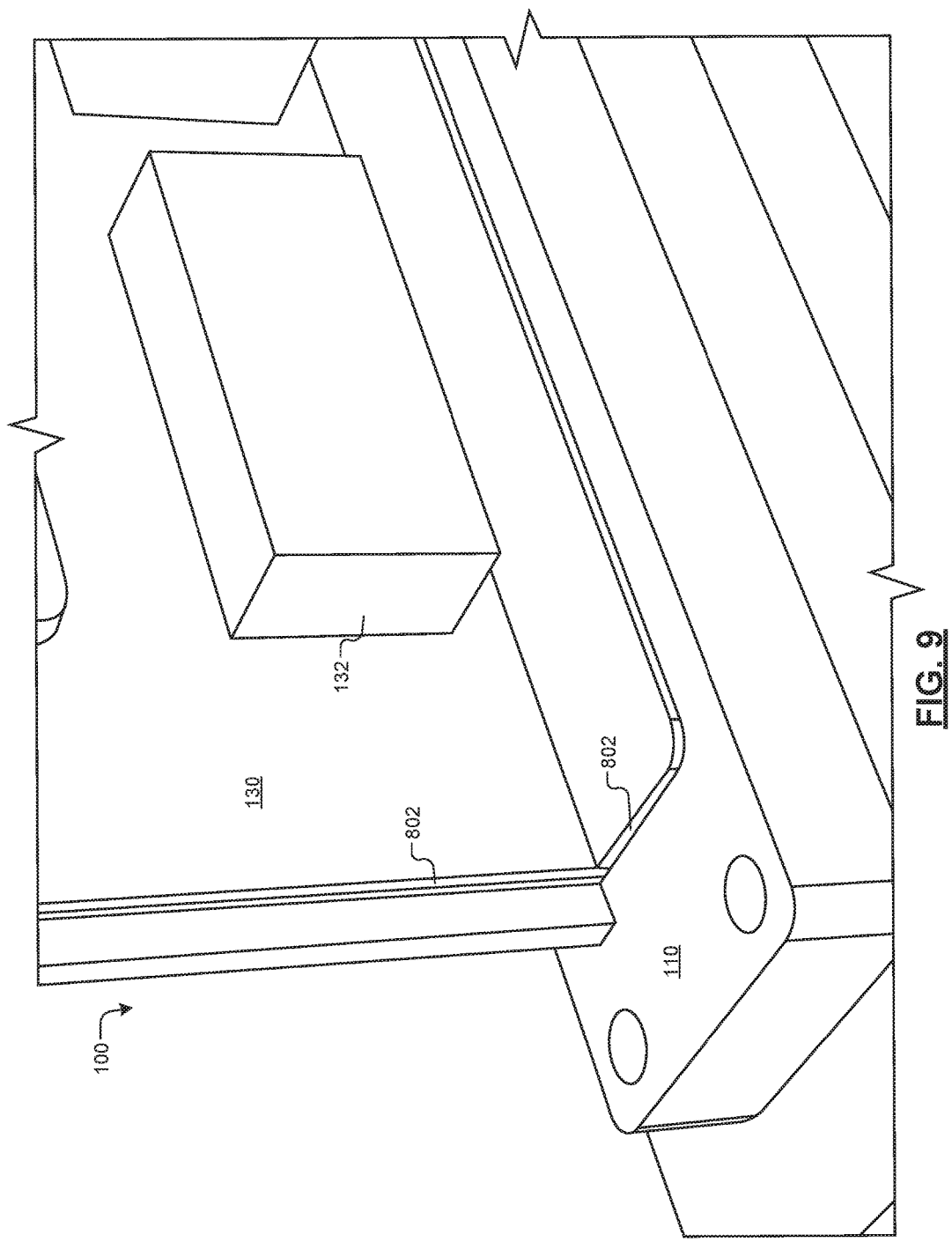
FIG. 9 is an isometric view of a connection block and a substrate defining a trough for receiving a membrane in accordance with an example embodiment of the present disclosure.
Figure 10:
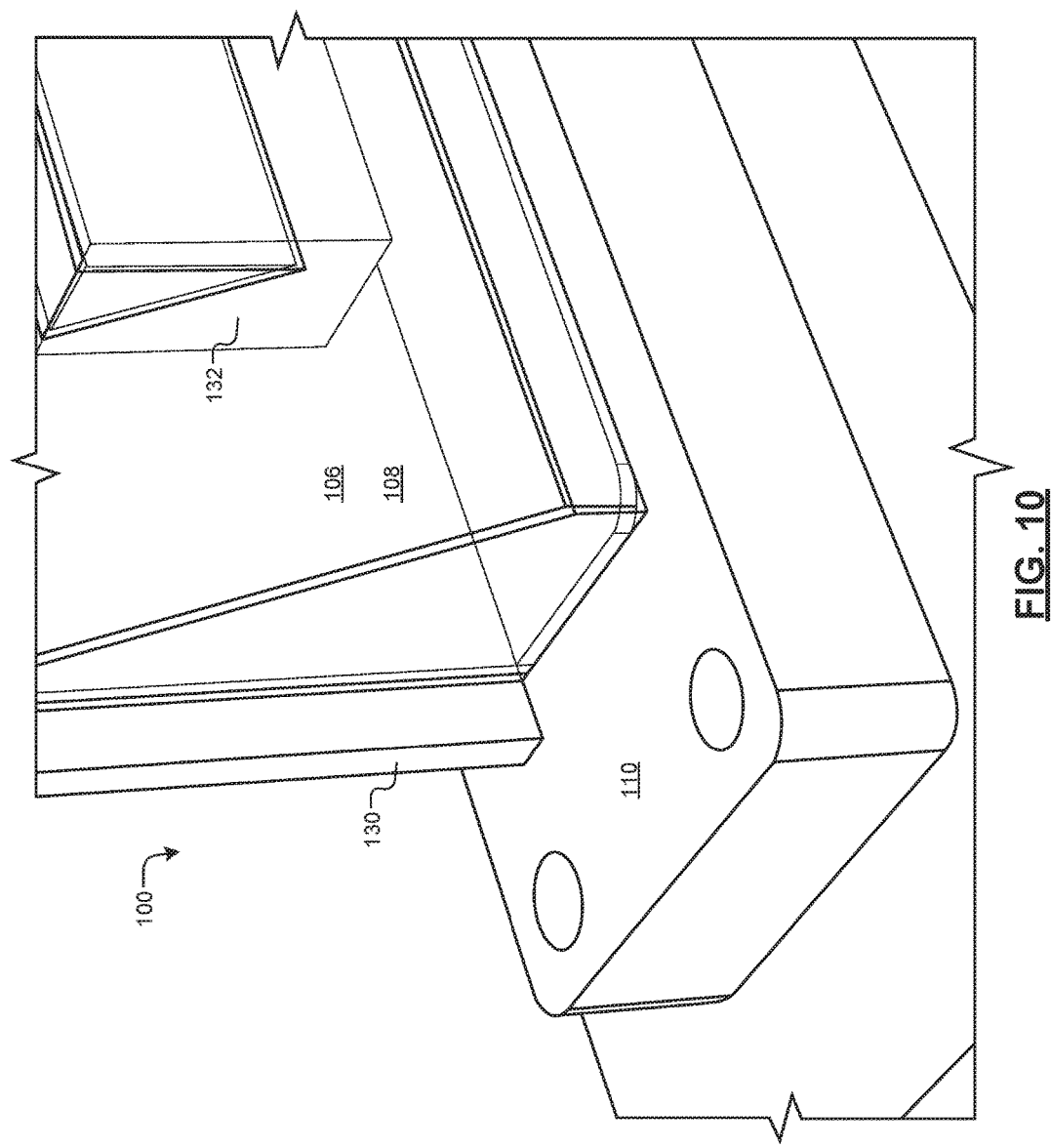
FIG. 10 is an isometric view of a membrane received by the trough defined in the connection block and the substrate in accordance with an example embodiment of the present disclosure.
Figure 11:
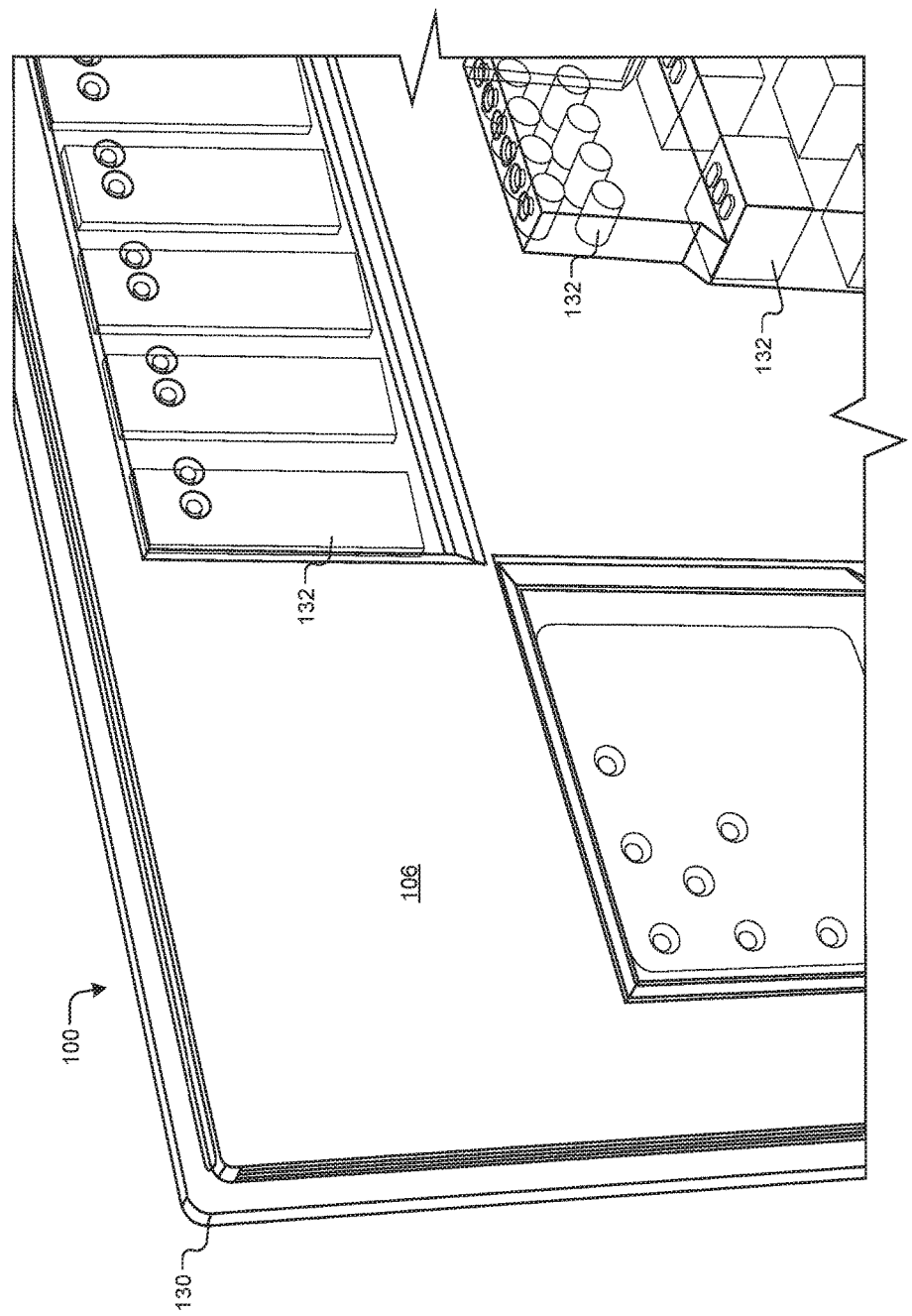
FIG. 11 is another isometric view of the membrane received by the trough in accordance with an example embodiment of the present disclosure.

FIGS. 9 through 11 illustrate an example embodiment of the cooling system 100 according to the present disclosure. In this embodiment, the membrane 106 includes a rigid material and is received by the connection block 110 and the substrate 130. As shown in FIG. 9, the connection block 110 and the substrate 130 define a channel 802 that receives the membrane 106. In one or more embodiments, the channel 802 receives an edge portion of the membrane 106.

In some embodiments, the membrane 106 includes sealant material disposed about the edge portion of the membrane 106 to create a seal when the membrane 106 is received by the channel 802. In other embodiments, the sealant material is disposed within the channel 802. In various examples, the sealant material includes urethane, neoprene, or the like.

FIGS. 10 and 11 illustrate the membrane 106 received by the channel 802 to form a volume 108. In some embodiments, the membrane 106 can be attached to the connection block 110 and/or the substrate 130 in addition to being received by the channel 802. For example, the membrane 106 can be attached to the connection block 110 and/or the substrate 130 with adhesive. In another example, the membrane 106 can be attached to the connection block 110 and/or the substrate 130 with fasteners, such as bolts, screws, or the like.

While FIGS. 10 and 11 illustrate the membrane 106 as being received by the channel 802, it is understood that the membrane 102 can also be received by a similar channel defined within the connection block 110 and/or the substrate 130.

Figure 12:
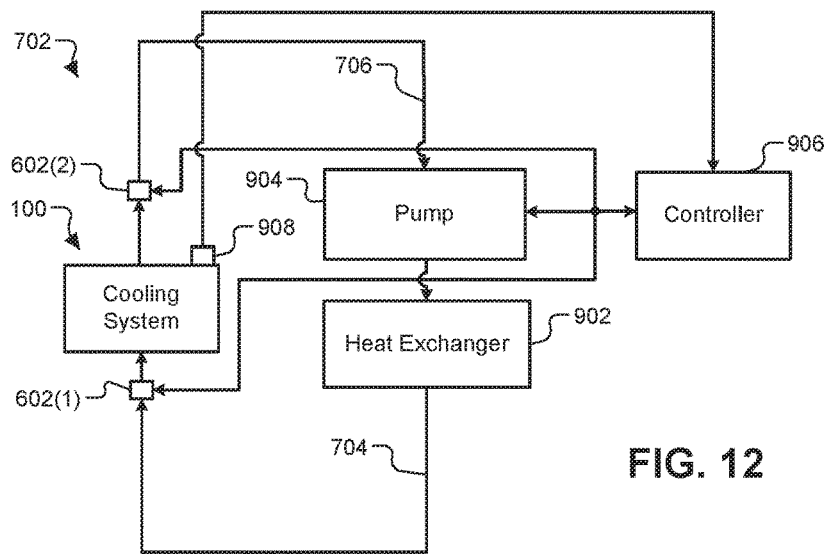
FIG. 12 is a block diagram illustrating an example coolant fluid delivery system in accordance with an example embodiment of the present disclosure.

FIG. 12 illustrates an example coolant circulation system 702. The coolant circulation system 702 can be employed with the embodiments of the cooling system 100 described herein. The coolant circulation system 702 includes a heat exchanger 902 and a pump 904. The heat exchanger 902 extracts heat from the coolant fluid allowing the coolant fluid to absorb additional heat when circulated through the cooling system 100. As shown, the heat exchanger 902 is disposed between the pump 904 and an inlet conduit 704 that defines a passage therein. The pump 904 is disposed between the heat exchanger and an outlet conduit 706 that defines a passage therein. The pump 904 displaces the coolant fluid within the coolant circulation system 702. Additionally, the pump 904 can be used to modify the pressure differential within the cooling system 100.

The coolant circulation system 702 includes a controller 906 that is connected to the pump 904 and the valves 602(1), 602(1). The controller 906 receives temperature parameters and/or pressure parameters from a sensor 908 disposed within the cooling system 100. For example, the sensor 908 can be disposed within a membrane 106 to measure a temperature within the volume 108. In another example, the sensor 908 can measure a pressure within the volume 108. The controller 906 also receives various parameter signals from the valves 602(1), 602(2) and the pump 904. For example, the valves 602(1), 602(2) can include sensors that provide signals indicative of a flowrate at the respective valve 602(1), 602(2). The pump 904 can also include a sensor that provides signals indicative of pumping characteristics to the controller 906.

The sensor 908 measures temperatures and/or pressures within the volume 108 and provides the measured values to the controller 906. Based upon the measured values, the controller 906 transmits control signals to the pump 904 and/or the valves 602(1), 602(2). For example, once the measured temperature exceeds a predetermined temperature threshold, the controller 906 causes the pump 904 to pump coolant fluid into the cooling system 100 and actuates the valves 602(1), 602(2) to control a flowrate through the coolant circulation system 702. Additionally, once the measured pressure exceeds a predetermined pressure threshold, the controller 906 actuates the valves 602(1), 602(2) to control a flowrate to regulate pressure within the cooling system 100. By regulating the pressure within the volume 108, the amount coolant fluid entering the volume 108 from the volume 104 can also be regulated.

In some embodiments, the substrate 130 and/or the heat-generating devices 132 include the sensor 908. In this embodiment, the heat-generating devices 132 (i.e., the server components) can directly actuate the valves 602(1), 602(2) to control the flowrate within the cooling system 100. The heat-generating devices 132 provide data indicating that the valve positions have been modified to the controller 906 to allow the controller 906 to actuate the pump 904 accordingly. In some embodiments, the controller 906 monitors fluid pressure at the inlet conduit 704 and/or the outlet conduit 706. Based upon the monitoring, the controller 906 can control the pump 904 to maintain a desired pressure level.

Figure 13:
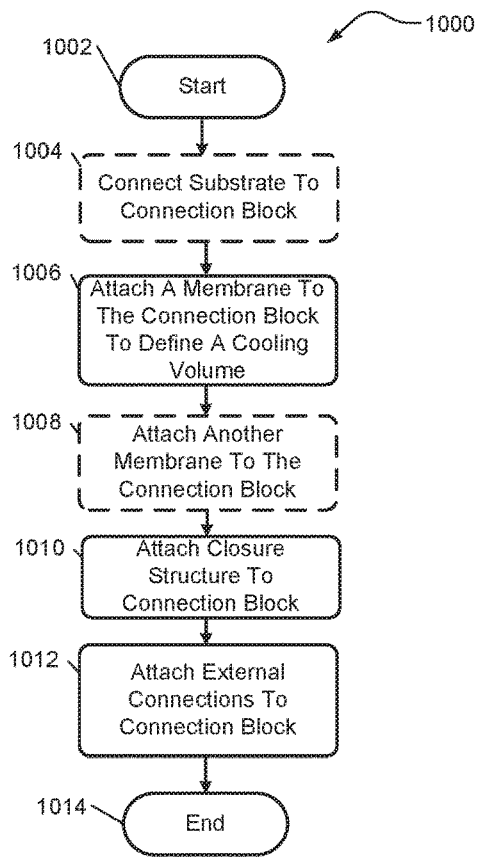
FIG. 13 is a flowchart illustrating an example method for assembling a cooling system in accordance with an example embodiment of the present disclosure.

FIG. 13 illustrates an example method 1000 for deploying a cooling system within a facility. The method 1000 begins at 1002. At 1004, the substrate is connected to the connection block. In various embodiments, the substrate 130 is connected to the connection block 110. For example, the connector 128 of the substrate 130 is mated to the connector 126 of the connection block 110. At 1006, a membrane is attached to the connection block to define a cooling volume. The membrane 106 is attached to the connection block 110 to enclose the substrate 130 within the volume 108. At 1008, another membrane may be attached to the connection block. For example, the membrane 102 defines the volume 104.

At 1010, a closure structure is attached to the connection block. In embodiments, the closure structure 134(1) and/or the closure structure 134(2) is attached to the connection block 110. As a result, the respective closure structure 134(1), 134(2) connects the ends 112, 114 to the connection block 110 to create a seal. At 1012, external connections are connected to the connection block. In one or more embodiments, external connectors, such as external electrical connections, external coolant fluid conduits, and the like, are connected to the connection block. At 1016, the method 1000 ends.

Figure 14:
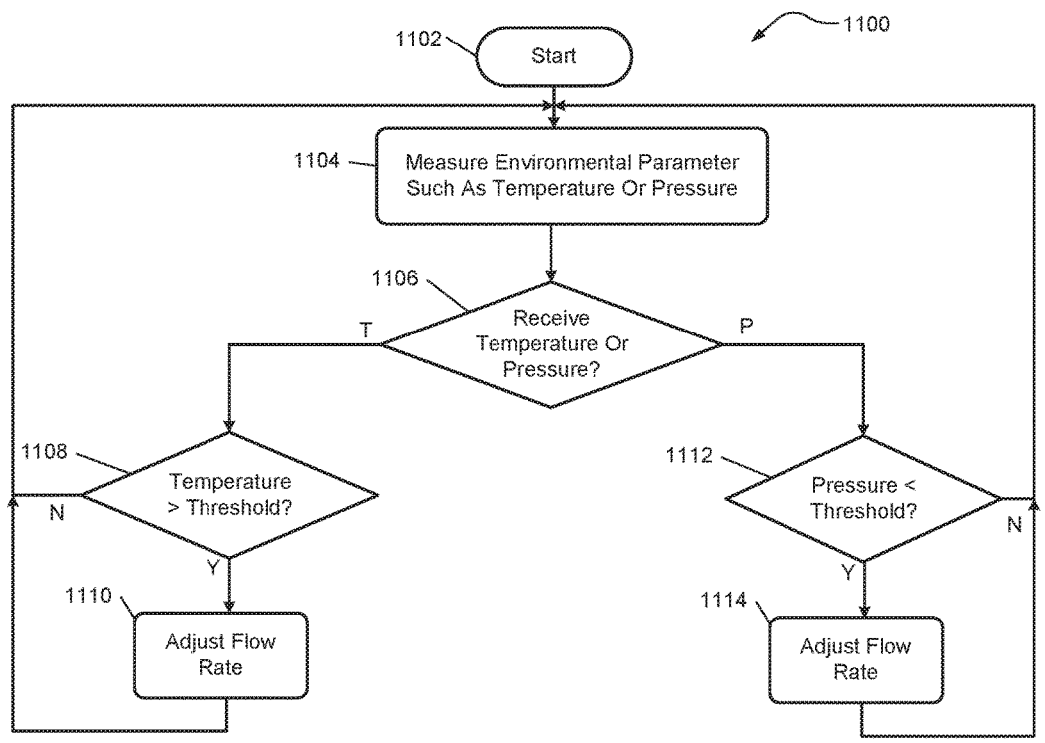
FIG. 14 is a flowchart illustrating an example method for controlling a coolant fluid delivery system in accordance with an example embodiment of the present disclosure.

FIG. 14 illustrates an example method 1100 for controlling a coolant fluid delivery system in accordance with an example embodiment of the present disclosure. The method 1100 begins at 1102. At 1104, an environmental parameter is measured within a cooling environment. For example, the sensor 908 measures temperature and/or pressure within the volume 108. In another example, the pump 904 and/or the valves 602(1), 602(2) provide parameter signals indicative of flowrate to the controller 906. At 1106, the method 1100 determines made of whether a temperature (T) parameter or a pressure (P) parameter was received.

If a temperature parameter was received, the method 1100 determines whether the temperature exceeds a predetermined temperature threshold at 1108. For example, the controller 906 compares the temperature with a predetermined temperature threshold. The predetermined temperature threshold may represent a maximum desired operating temperature. If the temperature does not exceed the predetermined temperature threshold, the method 1100 transitions to 1104. If the temperature parameter exceeds the predetermined environmental threshold, a flowrate is adjusted at 1110. For example, the controller 906 generates a control signal to actuate the pump 904 and/or the valve 602(1) to increase the flowrate of coolant fluid within the cooling system 100.

If a pressure parameter was received, the method 1100 determines whether the pressure exceeds a predetermined pressure threshold at 1112. For example, the controller 906 compares the measured pressure with a predetermined pressure threshold. The predetermined pressure threshold may represent a desired pressure to be maintained within the volume 108. For instance, the predetermined pressure threshold can represent the desired pressure to maintain a suitable pressure differential within the cooling system 100. If the pressure does not exceed the predetermined pressure threshold, the method 1100 transitions to 1104.

Figure 15:
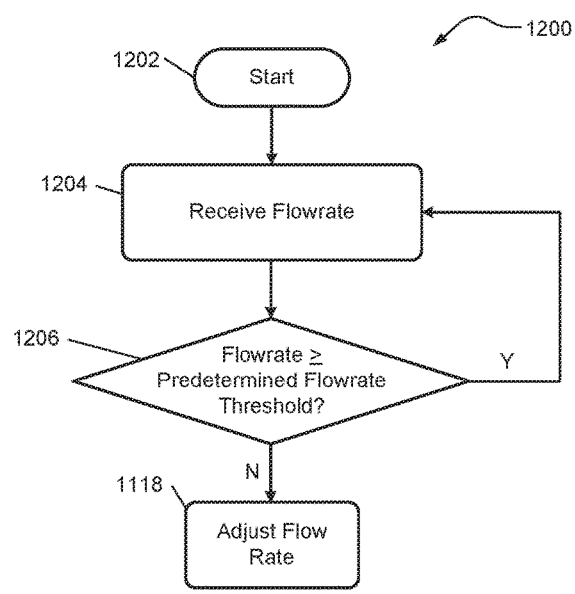
FIG. 15 is a flowchart illustrating another example method for controlling a coolant fluid delivery system in accordance with an example embodiment of the present disclosure.

FIG. 15 illustrates another example method 1200 for controlling a coolant fluid delivery system in accordance with an example embodiment of the present disclosure. The method 1200 begins at 1202. At 1204, a flowrate parameter is received. For example, the pump 904 and/or the valves 602(1), 602(2) provide parameter signals indicative of flowrate to the controller 906.

At 1206, the method 1200 determines whether the flowrate is greater than or equal to the predetermined flowrate threshold. For example, the controller 906 compares the measured flowrate with a predetermined flowrate threshold. The predetermined flowrate threshold represents a desired flowrate to be maintained within the volume 108. In one example, the predetermined flowrate threshold can represent the flowrate to maintain the desired operating temperature within the cooling system 100. If the flowrate is greater than or equal to the predetermined flowrate threshold, the method 1200 transitions to 1204.

If the flowrate is less than the predetermined flowrate threshold, a flowrate is adjusted at 1208. For example, the controller 906 generates a control signal to actuate the pump 904, the valve 602(1) and/or the valve 602(2) to modify the flowrate of coolant fluid within the cooling system 100. The flowrate can be adjusted based upon the difference between the measured flowrate and the predetermined flowrate threshold. The method 1200 transitions to 1204 to receive the flowrate parameter.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

The invention claimed is:

1. A cooling device, comprising:
   a connection block including a surface and including an inlet passage and an outlet passage;
   a first membrane defining a first volume with a first opening at a first end thereof, wherein the first membrane is sealingly engaged with the surface around the inlet passage;
   a second membrane defining a second volume with a second opening at a second end thereof and defining a plurality of apertures, wherein the second membrane is sealingly engaged with the surface inside of the first membrane and around the outlet passage; and
   a substrate that is arranged in the second membrane, that is connected to the surface, and that includes at least one heat-generating device, wherein coolant fluid flows into the first volume via the inlet passage, through the plurality of apertures into the second volume, and exits via the outlet passage.

2. The cooling device of claim 1, further comprising:
   a first closure structure configured to create a liquid impermeable seal at an interface formed between the surface and the first membrane; and
   a second closure structure configured to create a liquid impermeable seal at an interface formed between the surface and the second membrane.

3. The cooling device of claim 1, further comprising adhesive to create a liquid impermeable seal at an interface formed between the surface and the first membrane and the surface and the second membrane.

4. The cooling device of claim 1, further comprising thermoplastic material to create a first liquid impermeable seal at an interface formed between the surface and the first membrane and the surface and the second membrane.

5. The cooling device of claim 1, further comprising an elastic material to create a liquid impermeable seal at an interface formed between the surface and the first membrane and the surface and the second membrane.

6. The cooling device of claim 1, wherein the substrate includes a printed circuit board and the at least one heat-generating device comprises at least one of an electronic device and a heat sink.

7. The cooling device of claim 1, further comprising a plurality of internal support structures arranged inside of the second volume to internally support the second membrane.

8. The cooling device of claim 7, wherein the plurality of internal support structures include internal fluid passages.

9. The cooling device of claim 8, further comprising nozzles connected to at least one of the plurality of internal support structures to direct fluid towards the at least one heat-generating device.

10. The cooling device of claim 1, wherein the substrate includes a first connector and the connection block includes a second connector, and wherein the first connector mates with the second connector.

11. The cooling device of claim 10, wherein the substrate receives data and power signals via the first and second connectors.

12. A cooling device, comprising:
    a connection block including a surface and including an inlet passage and an outlet passage;
    a membrane defining a volume with a first opening at a first end thereof, wherein the membrane is sealingly engaged with the surface around the inlet passage and the outlet passage;
    a substrate that is arranged in the membrane, that is connected to the surface, and that includes at least one heat-generating device, wherein coolant fluid flows into the volume via the inlet passage and exits via the outlet passage; and
    a conduit in fluid communication with at least one of the inlet passage and the outlet passage, the conduit extending outwardly from the connection block in a cantilever configuration.

13. The cooling device of claim 12, further comprising:
    a closure structure configured to create a liquid impermeable seal at an interface formed between the surface and the membrane.

14. The cooling device of claim 12, further comprising adhesive to create a liquid impermeable seal at an interface formed between the surface and the membrane.

15. The cooling device of claim 12, further comprising thermoplastic material to create a liquid impermeable seal at an interface formed between the surface and the membrane.

16. The cooling device of claim 12, further comprising an elastic material to create a liquid impermeable seal at an interface formed between the surface and the membrane.

17. The cooling device of claim 12, wherein the connection block and the substrate define a channel configured to receive the membrane.

18. The cooling device of claim 12, further comprising a plurality of internal support structures arranged inside of the volume to internally support the membrane.

19. The cooling device of claim 18, further comprising nozzles connected to at least one of the plurality of internal support structures to direct fluid towards the at least one heat-generating device.

20. A cooling device for fluid submersion of heat-generating devices, comprising:
    a connection block including a surface and including an inlet passage and an outlet passage;
    a first membrane defining a first volume with a first opening at a first end thereof, wherein the first membrane is sealingly engaged with the surface around the inlet passage;
    a second membrane defining a second volume with a second opening at a second end thereof and defining a plurality of apertures, wherein the second membrane is sealingly engaged with the surface inside of the first membrane and around the outlet passage;
    a substrate that is arranged in the second membrane, that is connected to the surface, and that includes at least one heat-generating device, wherein coolant fluid flows into the first volume, through the plurality of apertures into the second volume, and exits the outlet passage; and
    a plurality of internal support structures arranged inside of the second volume to internally support the second membrane.

* * * * *